United States Patent [19]

Balakrishnan

[11] Patent Number: 4,697,858
[45] Date of Patent: Oct. 6, 1987

[54] ACTIVE BUS BACKPLANE

[75] Inventor: Ramanatha V. Balakrishnan, San Jose, Calif.

[73] Assignee: National Semiconductor Corporation, Santa Clara, Calif.

[21] Appl. No.: 827,296

[22] Filed: Feb. 7, 1986

[51] Int. Cl.4 .............................................. H01R 9/09
[52] U.S. Cl. ..................................... 439/61; 361/413; 439/62
[58] Field of Search ............ 339/17 L, 17 LM, 17 M, 339/17 LC; 361/407, 412, 413, 414, 415

[56] References Cited

U.S. PATENT DOCUMENTS

| | | | |
|---|---|---|---|
| 2,894,077 | 7/1959 | McCoy | 339/17 LM |
| 3,015,755 | 1/1962 | Wright et al. | 361/415 |
| 3,680,005 | 7/1972 | Jorgensen | 361/414 |
| 4,575,780 | 3/1986 | Brombal et al. | 361/413 |

Primary Examiner—Neil Abrams
Attorney, Agent, or Firm—Gail W. Woodward

[57] ABSTRACT

A digital bus backplane is disclosed that has interface circuitry located on the backplane. The backplane includes a backplane circuit board containing signal bus lines each operable for conducting electrical signals, several connectors each physically coupled to the backplane circuit board and each operable for electrically contacting the signal pins of a daughter board inserted into the connector, and many transceivers each physically coupled to the backplane circuit board and each electrically connected between one of the contact pins of a connector and one of the signal bus lines, where each transceiver is operable for relaying electrical signals between a daughter board and a signal bus line.

12 Claims, 8 Drawing Figures

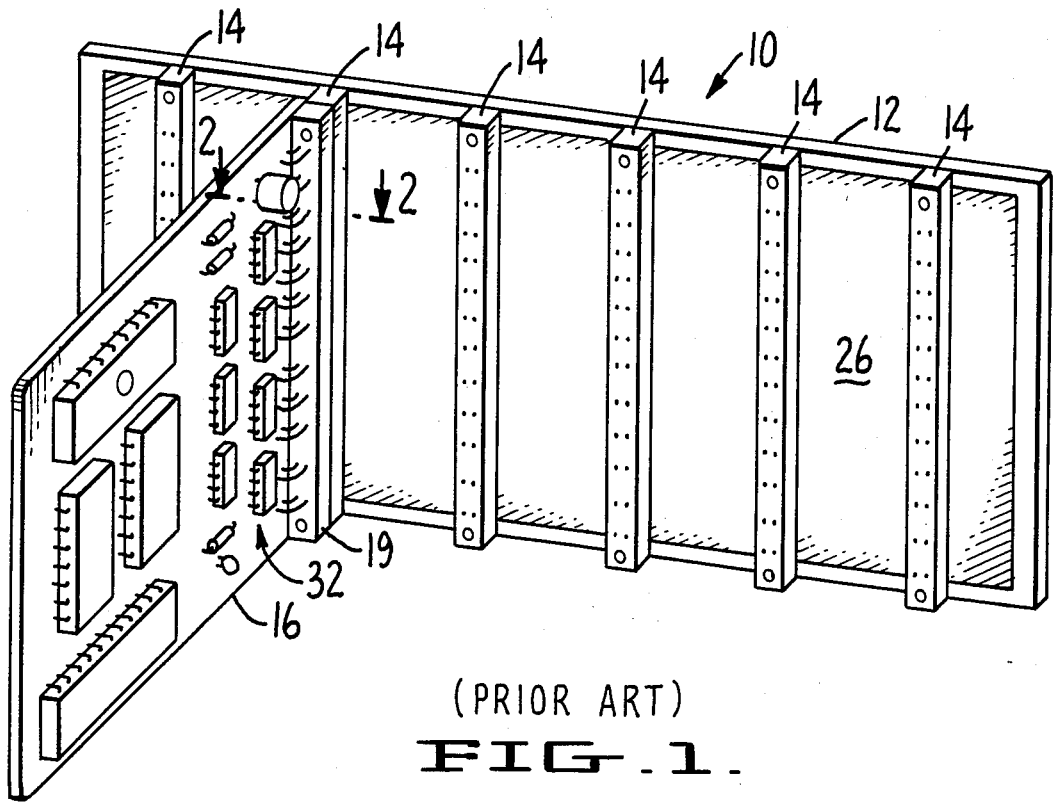
(PRIOR ART)
FIG. 1.
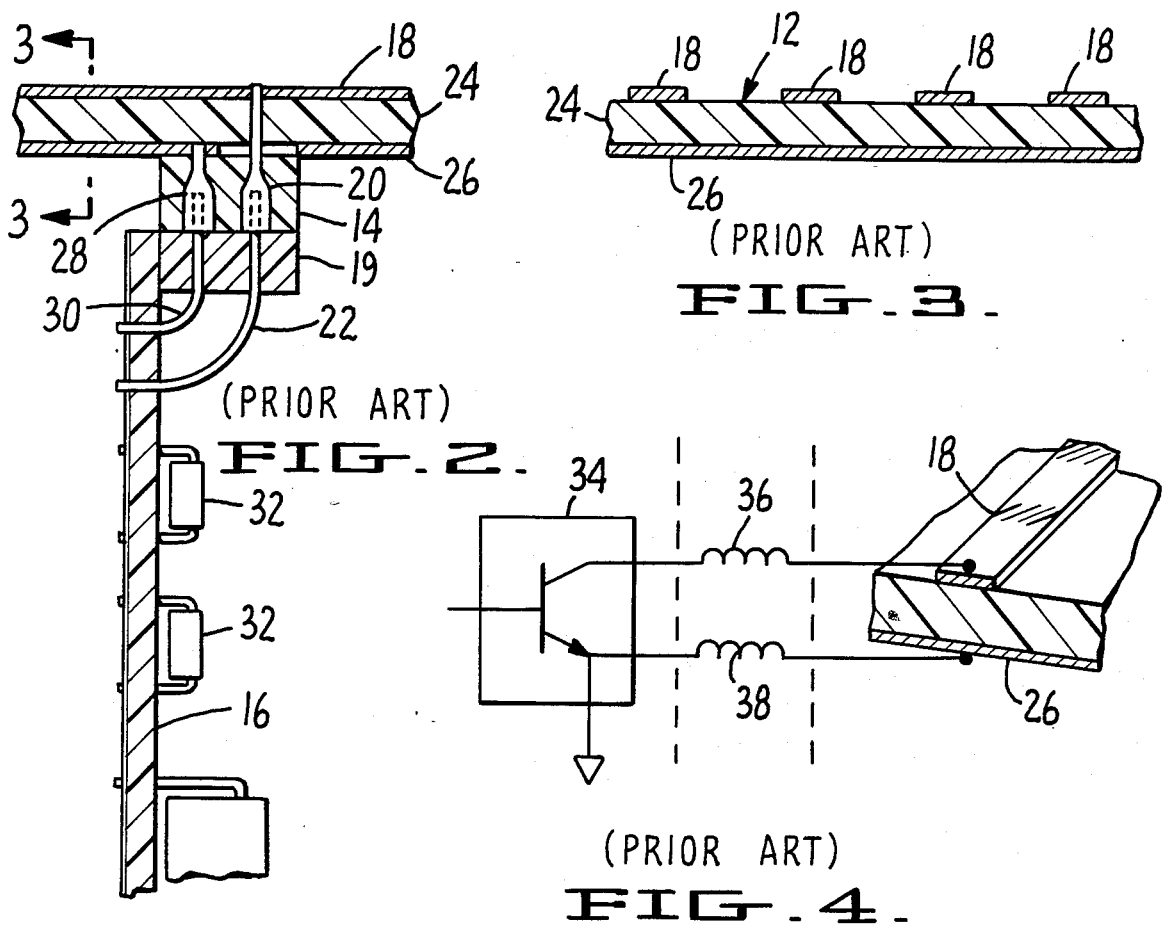
(PRIOR ART)
FIG. 3.
(PRIOR ART)
FIG. 2.
(PRIOR ART)
FIG. 4.

ACTIVE BUS BACKPLANE

BACKGROUND OF THE INVENTION

1. Field of the Invention

This invention relates generally to bus-oriented backplanes used for interconnecting electronic circuit boards that plug into the backplane, and relates more particularly to a digital bus backplane having interface circuitry located on the backplane.

2. Description of the Relevant Art

A backplane is an electro-mechanical structure that is used both as a mechanical structure for supporting several electronic daughter circuit boards that plug into the backplane and as a communication medium for electrically interconnecting the daughter circuit boards. A typical prior art backplane 10, as illustrated in FIG. 1, includes a backplane circuit board 12 and several backplane connectors 14 that extend across the width of the backplane circuit board. Each of the backplane connectors 14 receives and supports a daughter circuit board 16, which contains various circuitry that is usually digital in nature such as, for example, a computer processor or memory. The backplane 10 can support and interconnect any number of daughter circuit boards 16 up to the number of backplane connectors 14. The daughter circuit boards 16 interconnected by the backplane 10 comprise an electronic system, which, for example, might be a microcomputer.

In addition to supporting several daughter circuit boards 16, the backplane 10 also electrically interconnects the daughter circuit boards. The interconnections are usually implemented in the form of parallel bus lines 18 (FIGS. 2 and 3) that extend at right angles to the backplane connectors 14 from one end of the backplane circuit board 12 to the other. Each contact 20 of each backplane connector 14 is electrically connected to a bus line 18, with all similarly located contacts of each backplane connector being connected to the same bus line. When a daughter circuit board 16 is installed into the backplane 10 by plugging a daughter board connector 19 of the daughter circuit board into the backplane connector 14, each contact 20 of the backplane connector engages and establishes an electrical connection with a corresponding signal pin 22 of the daughter circuit board. Because similarly located contacts 20 of each backplane connector 14 are connected to the same bus line, the interconnections among the daughter circuit boards 16 are the same regardless of which backplane connector 14 the daughter circuit boards are plugged into.

Commonly, the backplane circuit board 12 is a two sided circuit board with the bus lines 18 located on one side of an insulative substrate 24 such as fiberglass, and a ground plane 26 located on the other side of the substrate. Such a backplane circuit board 12 is a microstrip type backplane, with the bus lines 18 shielded on one side by a ground plane. The ground plane 26 extends substantially across the length and width of the backplane circuit board 12. The daughter circuit board 16 is grounded to the ground plane 26 through a ground contact 28 of the backplane connector 14 that is electrically connected to the ground plane, and through a ground pin 30 of the daughter circuit board that engages the ground contact 28. In addition to providing a ground to the daughter circuit boards 16, the ground plane 26 also shields the bus lines 18 from the circuitry of the daughter circuit boards.

Most backplanes are constructed according to one of many backplane bus standards, such as Multibus or S-100. Each bus standard specifies which pins of the backplane connectors 14 provide power, ground, and signals to the daughter circuit boards. From the viewpoint of the daughter circuit board 16, the bus standard defines the size and shape of the daughter board connector 19 and the function of each signal pin 22. Most of the bus lines 18 are signal lines that carry data, address, and control signals among the various daughter circuit boards 16.

In prior art backplane systems, each daughter circuit board 16 includes several transceivers 32, each of which provides a bidirectional signal interface between the circuitry of the daughter circuit board and one of the bus lines 18. Since the transceiver 32 is located on the daughter circuit board 16, the transceiver is connected to its corresponding bus line 18 through the signal pins 22 of the daughter board connector 19 and the contact 20 of the backplane connector 14. Each transceiver 32 is operable for both sending digital information to and receiving digital information from its corresponding bus line 18. Typically, precharged bus lines 18 are utilized, so that to transfer digital information between daughter circuit boards 16 via the bus, the driver portion of a transceiver 32 selectively grounds the bus line to pull the voltage of the bus line to the logic low voltage and disconnects the bus line from ground to allow the bus line to return to the logic high voltage.

A schematic diagram of a typical open collector driver 34 is shown in FIG. 4. The collector of the driver 34 is connected to a bus line 18 through the signal pin 22 and the contact 20, while the emitter of the driver is connected to the local ground of the daughter circuit board 16, which is in turn connected to the ground plane 26 of the backplane 10 through the ground pin 30 and the ground contact 28. A control signal generated on the daughter circuit board 16 and supplied to the base of the driver 34 controls the operation of the driver. The inductances of the two connections between the driver 34 and the backplane 10 are represented by inductors 36 and 38.

Speed is perhaps the most important feature of any bus standard because the speed of the bus determines how quickly the daughter circuit boards 16 can communicate with each other, and, thus, determines the operational speed of the system. The maximum data transfer rate between two daughter circuit boards 16 is determined by the response times of the two daughter circuit boards plus the bus delay. The response time of the transmitting daughter circuit board is determined by the time required to discharge the bus line to ground through its driver, while the response time of the receiving daughter circuit board is determined by the time required for its receiver to respond to voltage changes that exceed the threshold voltage. The bus delay refers to the propagation delay of a signal travelling in a bus line between two connectors, with the worst case bus delay occurring between the two connectors located at the outer extremes of the backplane.

Signal speed is limited in prior art backplanes because of high inductance between each driver and its corresponding bus line. As seen in FIG. 4, all of the current that the driver 34 discharges from the bus line 18 to the ground plane 26 must pass through connectors 14 and 19, which contain a certain amount of inductance as represented by inductors 36 and 38. The energy stored in the inductors 36 and 38 limits the rise time of a signal pulse. If the rise time is too short, substantial ringing will occur, which may cause the signal pulse to pass through the threshold voltage and cause the receiver to sense false transitions. Thus, the inductance of the connectors slows the response time of the transmitting daughter circuit board.

Signal speed is also limited due to high capacitive loading on the bus line. The capacitance of each of the daughter circuit boards 16 significantly lowers the impedance of the backplane 10 when they are installed in the backplane. The capacitance added by each daughter circuit board 16 is due mainly to the driver, but also includes contributions by the receiver, the connector 19, and the circuit traces on the daughter circuit board. The addition of daughter circuit boards may, for example, reduce the impedance of the backplane from 100 ohms, when unloaded, to 20 ohms, when loaded. This lowered impedance significantly increases the propagation delay of the bus.

Signal noise is another limiting factor in the performance of a backplane. One source of signal noise has been discussed above, namely that caused by the inductance between the driver and bus and the resultant signal ringing. Another source of signal noise is due to uneven loading of the backplane. Since the effective impedance of the loaded backplane is significantly different from the effective impedance of the unloaded backplane, variations in impedance will occur whenever the backplane is not fully populated with daughter circuit boards. These impedance variations cause signal reflections that contribute to the noise problem.

Backplane performance is also impacted by the heat generated by the transceiver circuits. Due to the low impedance of the loaded backplane, the drivers must be large enough to handle substantial current loads. Unfortunately, high current devices generate a substantial amount of heat. This thermal energy is difficult to remove due to the close spacing of the backplane connectors 14, which restricts the effectiveness of heat sinks. Typically, cooling fans are used to blow air between the daughter circuit boards 16 to cool the transceivers, even when the remainder of the circuitry on the daughter circuit boards includes low power devices such as CMOS devices that would not otherwise require active cooling. Thermal considerations also limit the number of transceiver circuits that can be packaged in each chip, which means that several chips and a corresponding amount of board space is required for providing the interface circuitry on each daughter circuit board.

SUMMARY OF THE INVENTION

In accordance with the illustrated preferred embodiment, the present invention provides a digital bus backplane having interface circuitry located on the backplane. The backplane electrically interconnects several daughter circuit boards, where each of the daughter circuit boards includes one or more signal pins for transmitting and receiving electrical signals to and from the backplane. The backplane comprises: (1) a backplane circuit board containing one or more signal bus lines each operable for conducting electrical signals; (2) several connectors each physically coupled to the backplane circuit board and each operable for receiving one of the daughter circuit boards, where each connector includes one or more contact pins that electrically contact respective signal pins of a daughter circuit board inserted into the connector; and (3) many transceivers each physically coupled to the backplane circuit board and each electrically connected in series between one of the contact pins and one of the signal bus lines, where each transceiver is operable for relaying electrical signals between a contact pin and a signal bus line.

By repositioning the transceivers from the daughter circuit board to the backplane, the present invention provides several performance improvements over prior art backplanes. One improvement relates to the lowering of the driver impedance by eliminating the large inductance of the connectors between the driver and the backplane. Another improvement relates to the lowering of capacitive loading on the bus by eliminating the connector between the driver and backplane and by isolating the driver with a diode. Another improvement relates to the use of open collector drivers for minimum bus loading. Another improvement relates to the elimination of uneven bus loading and consequential signal reflections by isolating the backplane from the capacitance of the removable daughter circuit boards. Another improvement relates to the reduction of signal propagation delay by reducing bus loading capacitance. Another improvement relates to the reduction in drive current by raising the bus impedance. Another improvement relates to the reduction of ringing and noise problems by reducing the inductance of the driver circuit. Another improvement relates to the use of a stripline backplane having bus lines that are shielded by two ground planes in order to reduce cross-talk. Another improvement relates to the saving of space on the daughter circuit boards by relocating the transceiver chips to the backplane. Another improvement relates to the powering of the transceivers through jumpers located on installed daughter circuit boards. Another improvement relates to the reduction of heat generation by reducing the current requirements of the transceivers. Still another improvement relates to the simplification of cooling the transceivers by relocating the transceivers to an area where heat sinks can be used and where convection cooling is more effective.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is a perspective view of a backplane known in the prior art.

FIG. 2 is a sectional detail view of the prior art backplane of FIG. 1, and is taken along section line 2—2 of FIG. 1.

FIG. 3 is a sectional detail view of the prior art backplane of FIG. 1, and is taken along section line 3—3 of FIG. 2.

FIG. 4 is a schematic diagram of a driver circuit for the prior art backplane of FIG. 1.

DETAILED DESCRIPTION OF THE PREFERRED EMBODIMENT

FIGS. 1 through 8 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

Figure 5:
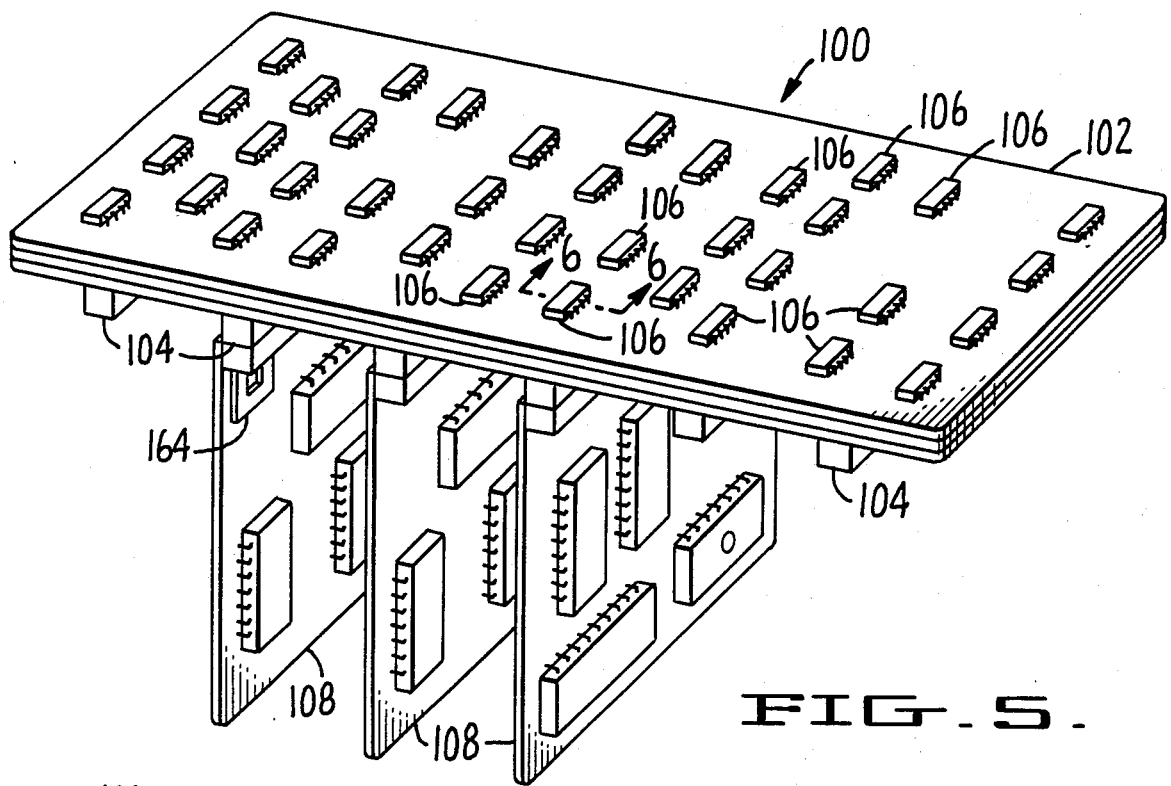
FIG. 5 is a perspective view of a backplane according to the present invention.

The preferred embodiment of the present invention is a digital bus backplane having interface circuitry, including transceivers, located on the backplane. In FIG. 5, a backplane 100 according to the present invention is shown as including a backplane circuit board 102, several backplane connectors 104 that extend across the width of the backplane circuit board at uniformly spaced intervals on one side of the backplane circuit board, and many transceiver chips 106 mounted on the opposite side of the backplane circuit board. Substantially all of the chips shown in FIG. 5 as mounted on the backplane circuit board 102 are transceiver chips 106. Each of the backplane connectors 104 is capable of receiving and supporting one daughter circuit board 108. The backplane circuit board 102 and the circuitry of the transceiver chips 106 electrically interconnect whatever daughter circuit boards 108 are installed in the backplane 100.

Figure 6:
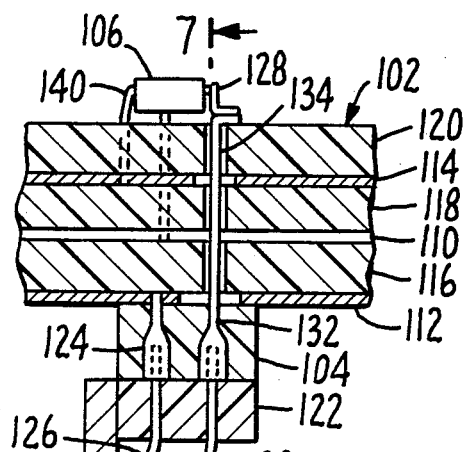
FIG. 6 is a sectional detail view of the backplane of FIG. 5, and is taken along section line 6—6 of FIG. 5.
Figure 7:
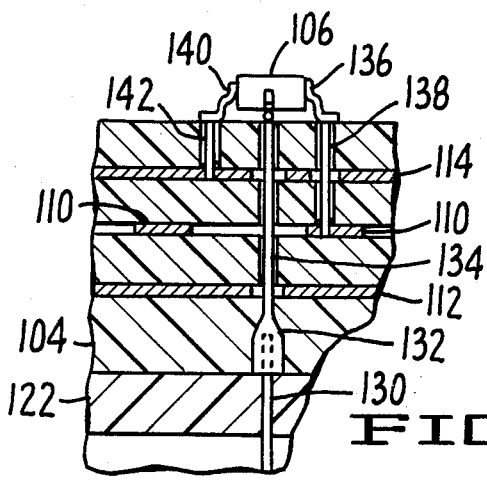
FIG. 7 is a sectional detail view of the backplane of FIG. 5, and is taken along section line 7—7 of FIG. 6.

Details of the interconnections among the backplane circuit board 102, a transceiver chip 106, and a daughter circuit board 108 are shown in FIGS. 6 and 7. The backplane circuit board 102 includes several bus lines 110 that extend across the length of the backplane circuit board between the two backplane connectors 104 at the outer extremes of the backplane 100. The bus lines 110 preferably are parallel conductive traces in an internal layer of a multilayer circuit board. The bus lines 110 are preferably shielded on two sides by ground planes 112 and 114 that are separated from the bus lines 110 by two insulative layers 116 and 118, which are preferably composed of fiberglass. The backplane circuit board 102, with the bus lines 110 disposed between and shielded by the two ground planes 112 and 114, provides a stripline type arrangement for the bus lines. Also preferably but not necessarily, the transceiver chip 106 is mounted to a third insulative layer 120 that covers the upper ground plane 114.

The daughter circuit board 108 is coupled to the backplane via a daughter board connector 122 that engages the backplane connector 104. The daughter circuit board 108 is grounded to ground plane 112 through a ground contact 124 of the backplane connector 104 that is electrically connected to the ground plane, and a ground pin 126 of the daughter board connector 122 that engages the ground contact 124. The daughter circuit board 108 is electrically connected to a first terminal 128 of the transceiver chip 106 through a signal pin 130 of the daughter board connector 122, a contact 132 of the backplane connector 104 that engages the signal pin, and a feed-through 134 of the backplane circuit board 102 that is electrically connected to the first terminal of the transceiver chip. The transceiver chip 106 is also electrically connected through a second terminal 136 and a feed-through 138 to a bus line 110, and through a third terminal 140 and a feed-through 142 to the upper ground plane 114. Note that the relative positions of the terminals 128, 136, and 140 have been rotated for clarity between FIGS. 6 and 7. While pin and socket type connectors are illustrated in FIGS. 6 and 7, understand that other types of connectors such as board edge connectors could also be used to accomplish the same purpose of supporting the daughter circuit board 108 and electrically connecting the daughter circuit board to the backplane 100.

Figure 8:
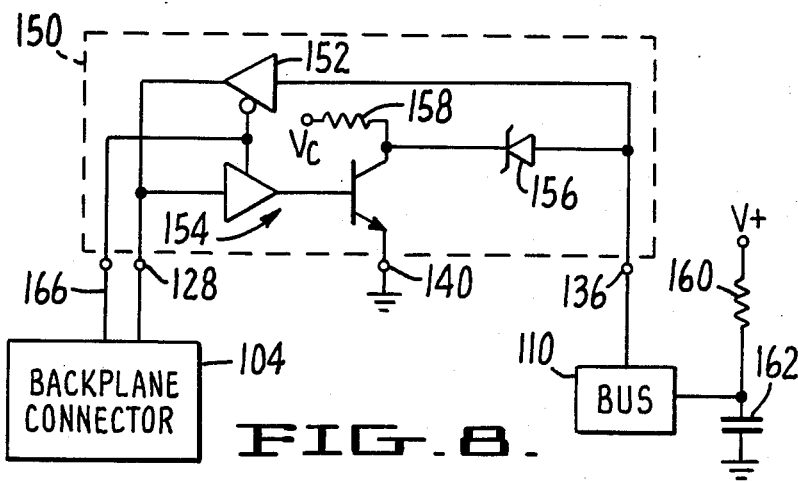
FIG. 8 is a schematic diagram of a transceiver circuit for the backplane of the present invention.

Within the transceiver chip 106 is one, or preferably several, transceiver circuits 150. As shown in FIG. 8, the transceiver circuit 150 includes a receiver 152 coupled between the bus line 110 and the backplane connector 104, with the input terminal of the receiver connected to the second terminal 136 of the transceiver chip 106, and with the output terminal of the receiver connected to the first terminal 128 of the transceiver chip. Also coupled between the bus line 110 and the backplane connector 104 and in parallel with the receiver 152 is an open collector driver 154, with the input terminal of the driver connected to the first terminal 128 of the transceiver chip 106, and with the collector of the driver connected through a diode 156 to the second terminal 136 of the transceiver chip. The anode of the diode 156 is connected to the second terminal 136, while the cathode of the diode is connected to the collector of the driver 154. The collector of the driver 154 is also connected to a source of positive voltage, Vc, through a pull-up resistor 158. The emitter of the driver 154 is connected to the third terminal 140 of the transceiver chip, which is in turn connected to the upper ground plane 114. FIG. 8 also shows that the bus line 110 is precharged to a positive voltage, V+, through a pull-up resistor 160 that is isolated from ground by a capacitor 162.

In operation, the transceiver circuit 150 functions in much the same manner as prior art transceivers positioned on the daughter circuit boards, but, by virtue of its location on the backplane 100, increases the performance of the backplane. The open collector transistor of the driver 154 presents a conductive path to ground for the charged bus line 110, with a minimum of impedance. When the driver 154 is on, the charge on the bus line 110 drains through the diode 156 and transistor to the ground plane 114. When the driver 154 is off, the diode is reverse biased by Vc, which isolates the capacitance of the driver from the bus line 110. The voltage of Vc is not less than a diode drop below V+, so that the diode 156 is conductive only when the driver 154 is on. The diode 156 is preferably a Schottky diode because such a diode has a low voltage drop in order to minimize any restriction to current flowing through the driver 154. The receiver 152 and driver 154 are conventional receiver and driver circuits, preferably bipolar TTL circuits.

Optionally, the power for the transceiver circuit 150 may be routed through a jumper 164 located on the daughter circuit board 108 (see FIG. 5). The jumper 164 relays power from the backplane power bus lines to the transceiver circuit 150 only when the daughter circuit board 108 is installed in the backplane 100. When no daughter circuit board 108 is installed in a particular backplane connector 104, the transceiver circuits coupled to that connector are not powered up, thus reducing the power consumption of the system.

The above described connections between the transceiver chip 106 and the daughter board 108 are utilized in transferring data between the daughter board and the bus lines 110 via the transceiver circuit 150. In addition, there is a signal path 166 that is used to transmit a direction control signal from the daughter board 108 to the transceiver chip 106. The direction control signal, which is generated by the circuitry of the daughter board 108, defines whether the transceiver is to operate in its receiving mode, wherein the driver is disabled, or in its transmitting mode, wherein the receiver is disabled. The direction control signals must pass through the connectors 104 and 122 because the transceiver chips 106 are located apart from the daughter boards 108, unlike prior art backplanes where the transceiver chips are mounted on the daughter boards and the direction control signals are internal to the daughter board.

From the above description, it will be apparent that the invention disclosed herein provides a novel and advantageous digital bus backplane having interface circuitry located on the backplane. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A backplane for electrically interconnecting a plurality of daughter circuit boards, wherein each of the daughter circuit boards includes one or more signal pins for transmitting and receiving electrical signals to and form said backplane, said backplane comprising:
   a backplane circuit board containing one or more signal bus lines each operable for conducting electrical signals;
   a plurality of connectors each physically mounted upon and electrically coupled to said backplane circuit board and each operable for receiving one of the daughter circuit boards, wherein each connector includes one or more contact pins that electrically contact respective signal pins of a daughter circuit board inserted into said connector; and
   a plurality of transceivers each physically mounted upon said backplane circuit board and each electrically connected between one of said contact pins and one of said signal bus lines, wherein each transceiver is operable for electrically isolating and for relaying electrical signals between said one contact pin and said one signal bus line.

2. A backkplane as recited in claim 1 wherein said backplane circuit board includes a multilayer printed circuit board with two parallel ground planes separated by an insulatice laayer, and with said signal bus lines disposed between said ground planes and within said insulative layer.

3. A backplane as recited in claim 1 wherein said connectors are physically mounted upon said backplane circuit board by mounting said connectors directly to one side of said backplane circuit board, and wherein said transceivers are physically mounted upon said backplane circuit board by mounting said transceivers directly to the other side of said backplane circuit board.

4. A backplane as recited in claim 1 wherein each transceiver includes a receiver and a driver, wherein an input terminal of said receiver and an output terminal of said driver are coupled to one of said signal bus lines of said backplane circuit board, and wherein an output terminal of said receiver and an input terminal of said driver are coupled to one of said contact pins of said connector.

5. A backplane as recited in claim 1 further comprising bus charging means for charging said signal bus lines to a logic high voltage, wherein said transceiver includes an open collector driver having an input terminal coupled through one of said contact pins to a signal pin of a daughter circuit board inserted into said connector, having a collector coupled to one of said signal bus lines, and having an emitter coupled to ground, and wherein said open collector driver is responsive to command signals from said daughter circuit board to either turn on to discharge said signal bus line to ground or to turn off to isolate said signal bus line from ground.

6. A backplane as recited in claim 5 wherein said emitter is coupled to ground by connection to a ground plane of said backplane circuit board.

7. A backplane as recited in claim 5 wherein said transceiver further includes a diode connected in series between said signal bus line and said collector with the anode of said diode connected to said signal bus line and the cathode of said diode connected to said collector, and includes means for reverse biasing said diode when said driver is turned off.

8. A backplane as recited in claim 7 wherein said means for reverse biasing includes a pull-up resistor coupled between the cathode of said diode and a source of positive voltage.

9. A backplane as recited in claim 7 wherein said diode comprises a Schottky diode.

10. A backplane as recited in claim 1 wherein each of said transceivers is powered through a jumper connection contained on a daughter circuit board inserted into the connector that is coupled to said transceiver, and wherein said transceiver receives no power when said daughter circuit board is not inserted into said connector.

11. A computer bus backplane for electrically interconnecting a plurality of circuit boards, wherein each of the circuit boards includes one or more signal pins for transmitting and receiving electrical signals to and from said backplane, said backplane comprising:
   a backplane circuit board containing one or more signal bus lines each operable for conducting electrical signals, wherein said signal bus lines are disposed between two ground planes and within an insulative layer that separates said two ground planes;
   a plurality of connectors each mounted to one side of said backplane circuit board and each operable for receiving one of the circuit boards, wherein each connector includes one or more contact pins that electrically contact respective signal pins of a circuit board inserted into said connector; and
   a plurality of transceivers each mounted to the other side of said backplane circuit board, wherein each transceiver includes an open collector driver having an input terminal coupled through one of said contact pins to a signal pin of a circuit board, having a collector coupled to one of said signal bus lines through a diode, and having an emitter coupled to one of said ground planes, Wherein said open collector driver is responsive to command signals from said circuit board to either turn on to connect said signal bus line to said ground plane or to turn off to isolate said signal bus line from ground, and wherein said transceiver also includes a receiver having an input terminal coupled to said signal bus line and having an output terminal coupled to said contact pin of said connector and operable for relaying signals from said signal bus line to said contact pin.

12. A computer bus backplane for interconnecting a plurality of removable electronic circuit boards, wherein each of the removable circuit boards includes one or more output pins for transmitting electrical signals to said backplane, said backplane comprising:

a backplane circuit board containing one or more signal bus lines each extending along the length of said backplane circuit board and each operable for conducting electrical signals;

a plurality of connectors mounted to said backplane circuit board and each operable for receiving one of the removable circuit boards, wherein each connector includes one or more contact pins that electrically contact respective output pins of the removable circuit board; and a plurality of drivers each electrically connected between one of said contact pins of a connector and one of said signal bus lines of said backplane circuit board, wherein each driver is operable for relaying electrical signals from said one contact pin to said one signal bus line.

* * * * *